US012665588B2

(12) United States Patent
Kwon et al.

(10) Patent No.: US 12,665,588 B2
(45) Date of Patent: Jun. 23, 2026

(54) METHOD AND APPARATUS FOR PROTECTING PARTS IN CASE OF OVERVOLTAGE AND UNDERVOLTAGE

(71) Applicants: Hyundai Motor Company, Seoul (KR); Kia Corporation, Seoul (KR); Hyundai Mobis Co., Ltd., Seoul (KR); MOTLAB Co., Ltd, Yongin-si (KR)

(72) Inventors: Mun Soon Kwon, Yongin-si (KR); Seung Woo Shin, Hwaseong-si (KR); Nam Jong Kim, Yongin-si (KR)

(73) Assignees: Hyundai Motor Company, Seoul (KR); Kia Corporation, Seoul (KR); Hyundai Mobis Co., Ltd., Seoul (KR); Motlab Co., Ltd, Gyeonggi-Do (KR)

( * ) Notice: Subject to any disclaimer, the term of this patent is extended or adjusted under 35 U.S.C. 154(b) by 268 days.

(21) Appl. No.: 18/433,820

(22) Filed: Feb. 6, 2024

(65) Prior Publication Data

US 2024/0429909 A1 Dec. 26, 2024

(30) Foreign Application Priority Data

Jun. 21, 2023 (KR) ........................ 10-2023-0079498

(51) Int. Cl.
*H03K 17/08* (2006.01)
(52) U.S. Cl.
CPC .................................. *H03K 17/08* (2013.01)

(58) Field of Classification Search
CPC ........ H03K 17/08; H02H 9/043; H02H 9/044; B60L 50/60
See application file for complete search history.

(56) References Cited

U.S. PATENT DOCUMENTS

| | | | | |
|---|---|---|---|---|
| 7,633,249 B2 * | 12/2009 | Sekimoto | .............. | H02M 5/458 |
| | | | | 318/609 |
| 8,324,846 B2 * | 12/2012 | Marchand | ............... | B60L 50/61 |
| | | | | 318/362 |
| 9,632,374 B2 * | 4/2017 | Murakami | ............. | H02H 9/043 |

\* cited by examiner

*Primary Examiner* — Crystal L Hammond
*Assistant Examiner* — Samantha L Faubert
(74) *Attorney, Agent, or Firm* — Slater Matsil, LLP

(57) ABSTRACT

An embodiment circuit includes a load circuit including a first insulated gate bipolar transistor (IGBT), a second IGBT, and a component, a first end of the component being connected to the first IGBT and a second end of the component being connected to the second IGBT, a first circuit including a first capacitor and a relay switch which are connected in series, and a second circuit including a second capacitor and a third capacitor, wherein the second capacitor and the third capacitor are connected in series, wherein the load circuit, the first circuit, and the second circuit are connected in parallel, and wherein the relay switch is open or closed based on a magnitude of an output voltage of the component.

20 Claims, 13 Drawing Sheets rapid acceleration
from 0 kph to 180 kph rapid deceleration
from 180 kph to 0 kph voltage of input
power terminal
(HV load)

current of input
power terminal
(HV load)

ripple occurring section peak voltage start point (737 V < Hysteresis < 740 V)

(700 V < Hysteresis < 703 V)

METHOD AND APPARATUS FOR PROTECTING PARTS IN CASE OF OVERVOLTAGE AND UNDERVOLTAGE

CROSS-REFERENCE TO RELATED APPLICATIONS

This application claims the benefit of Korean Patent Application No. 10-2023-0079498, filed on Jun. 21, 2023, which application is hereby incorporated herein by reference.

TECHNICAL FIELD

The present disclosure relates to a method and apparatus for protecting parts in case of overvoltage or undervoltage.

BACKGROUND

The contents described below merely provide background information related to embodiments of the present disclosure and do not constitute prior art.

An electric vehicle is equipped with high-voltage parts. Representative high-voltage parts for electric vehicles include inverters that control electric motors to drive the electric vehicles, vehicle-mounted chargers, converters, electric heaters, and high-voltage batteries. Overvoltage means a phenomenon in which a higher voltage than the original line voltage is supplied. Undervoltage means that a lower voltage than a target voltage is supplied. In an overvoltage section or an undervoltage section, failure of a high-voltage part or an element of the part may occur. In order to solve such a failure problem, it is necessary to connect a circuit including a capacitor to a part to protect the corresponding part in the overvoltage section or the undervoltage section.

SUMMARY

The present disclosure relates to a method and apparatus for protecting parts in case of overvoltage or undervoltage. Particular embodiments relate to a method and apparatus for protecting parts by using a protection circuit for preventing failure of the parts when overvoltage or undervoltage occurs.

According to embodiments of the present disclosure, a circuit includes a load circuit comprising a first insulated gate bipolar transistor (IGBT), a second IGBT, and a component, a first end of the component being connected to the first IGBT and a second end of the component being connected to the second IGBT, a first circuit comprising a first capacitor and a relay switch which are connected in series, and a second circuit comprising a second capacitor and a third capacitor, wherein the second capacitor and the third capacitor are connected in series, wherein the load circuit, the first circuit, and the second circuit are connected in parallel, and wherein the relay switch is open or closed based on a magnitude of an output voltage of the component.

According to embodiments of the present disclosure, a method performed by a vehicle controller includes monitoring a plurality of devices in a vehicle and controlling a relay switch based on a magnitude of an output voltage of a component in the vehicle and the plurality of devices, wherein the relay switch is opened or closed based on the magnitude of the output voltage of the component, and wherein the component and the relay switch are connected in parallel.

DETAILED DESCRIPTION OF ILLUSTRATIVE EMBODIMENTS

Figure 1:
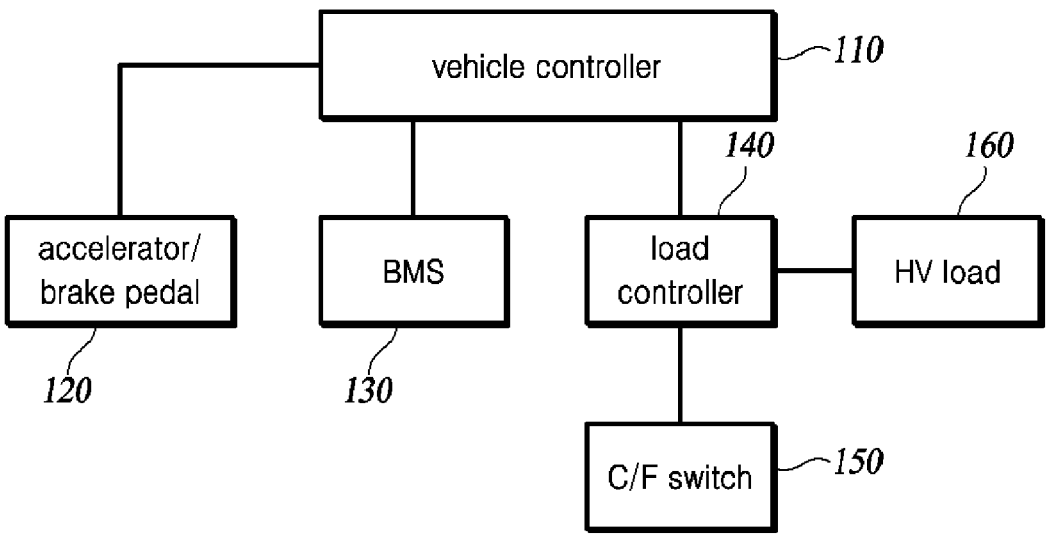
FIG. 1 is a block diagram illustrating a system for controlling an output voltage of a load, according to one embodiment of the present disclosure.

Embodiments of the present disclosure provide a method and apparatus for protecting parts and internal elements of parts in an overvoltage section or an undervoltage section.

In addition, embodiments of the present disclosure provide a method and apparatus for preventing failure of a part in the overvoltage section or the undervoltage section by connecting a circuit including a capacitor to the part in parallel.

Further, embodiments of the present disclosure provide a method and apparatus for controlling a voltage output from a load through relay control.

Furthermore, embodiments of the present disclosure provide a method and apparatus for controlling a voltage output from a load in consideration of time and magnitude of a voltage in the overvoltage section or the undervoltage section.

The objects achievable by embodiments of the present disclosure are not limited to the objects mentioned above, and other objects not mentioned will be clearly understood by those skilled in the art from the description below.

Hereinafter, some exemplary embodiments of the present disclosure will be described in detail with reference to the accompanying drawings. In the following description, like reference numerals preferably designate like elements, although the elements are shown in different drawings. Further, in the following description of some embodiments, a detailed description of known functions and configurations incorporated therein will be omitted for the purpose of clarity and for brevity.

Additionally, various terms such as first, second, A, B, (a), (b), etc. are used solely to differentiate one component from the other but not to imply or suggest the substances, order, or sequence of the components. Throughout this specification, when a part 'includes' or 'comprises' a component, the part is meant to further include other components, not to exclude thereof unless specifically stated to the contrary. The terms such as 'unit', 'module', and the like refer to one or more units for processing at least one function or operation, which may be implemented by hardware, software, or a combination thereof.

The following detailed description, together with the accompanying drawings, is intended to describe exemplary embodiments of the present invention and is not intended to represent the only embodiments in which the present invention may be practiced.

FIG. 1 is a block diagram illustrating a system for controlling an output voltage of a load, according to one embodiment of the present disclosure.

Referring to FIG. 1, the system for controlling the output voltage of the load may include a vehicle controller 110, an accelerator/brake pedal 120, a battery management system (BMS) 130, a load controller 140, a center/facia (C/F) switch 150, a high voltage (HV) load 160, and the like. The vehicle controller 110 may monitor the accelerator/brake pedal 120 and the battery management system (BMS) 130 and transmit a relay control signal to the load controller 140 according to relay control logic. The vehicle controller 110 may include a trained learning model. The learning model may correspond to a deep learning-based model. The vehicle controller 110 may further include a learning unit (not shown) for pre-training the learning model. The learning unit may train the learning model in advance using supervised learning, unsupervised learning, semi-supervised learning, and/or reinforcement learning. In this case, a specific method in which the learning unit trains the learning model based on learning data is common in the field, so detailed descriptions thereof will be omitted. The learning model in the vehicle controller 110 may transmit a relay control signal to the load controller 140 according to the relay control logic.

The load controller 140 may receive a relay control signal from the vehicle controller 110 and control the HV load 160 using the relay control signal. For example, the HV load 160 may correspond to a high-voltage part such as an electric compressor or an air conditioning heater. The load controller 140 may turn on/off a relay switch connected in parallel to the HV load 160. An input signal of the C/F switch 150 may be transmitted to the load controller 140. The load controller 140 may control the HV load 160 using this input signal. The load controller 140 may also include a trained learning model. The learning model in the load controller 140 may turn on/off the relay switch connected in parallel to the HV load 160.

Figure 2A:
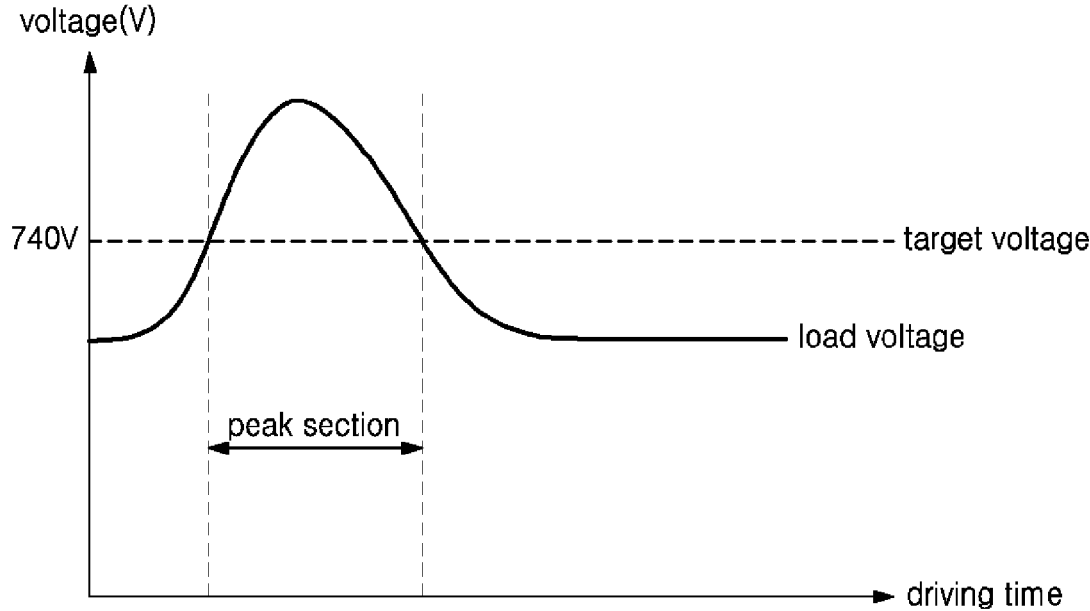
FIGS. 2A and 2B are diagrams for explaining an overvoltage section and an undervoltage section, according to one embodiment of the present disclosure.
Figure 2B:
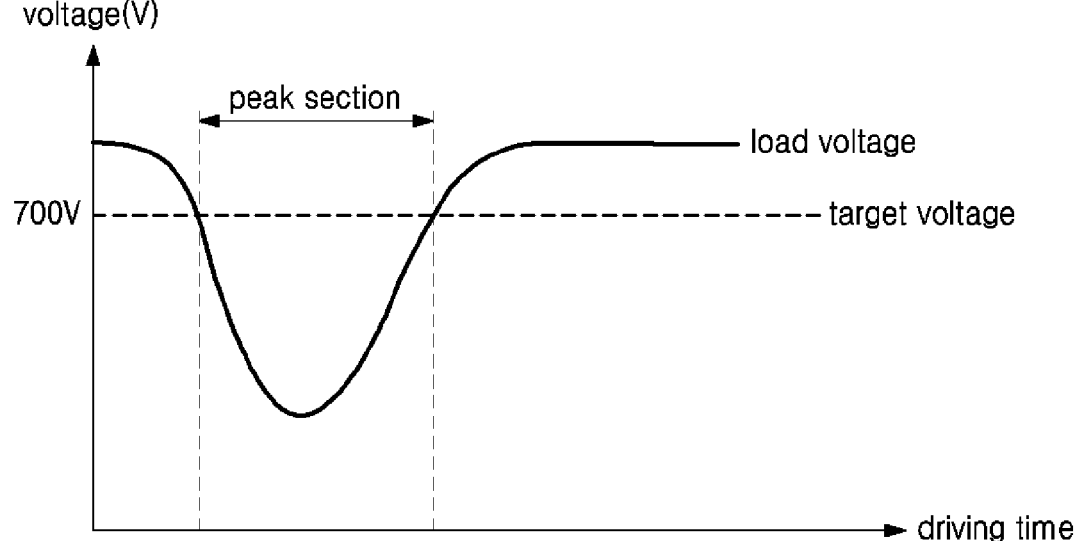

FIGS. 2A and 2B are diagrams for explaining an overvoltage section and an undervoltage section, according to one embodiment of the present disclosure. When an overvoltage or undervoltage occurs in a high voltage system, a failure may occur in a high-voltage part or an internal element of the corresponding part. The overvoltage section and the undervoltage section may correspond to the same meaning as a peak section. The overvoltage peak section may correspond to a section in which the output voltage of the load is greater than a target voltage. The undervoltage peak section may correspond to a section in which the output voltage of the load is smaller than the target voltage. The overvoltage peak section and the overvoltage section may correspond to the same meaning. The undervoltage peak section and the undervoltage section may correspond to the same meaning. The overvoltage and the high voltage may be used interchangeably. In the overvoltage section, low current may flow to the load. For example, the overvoltage section may be caused by a transient voltage or a surge voltage. In the undervoltage section, overcurrent may flow to the load. For example, the low voltage section may be caused by a voltage drop. The rated voltage is the maximum value of DC voltage or AC voltage that can be continuously applied at the rated ambient temperature or terminal temperature.

Referring to FIG. 2A, for example, the rated voltage may correspond to 720V and the target voltage of the high-voltage part may correspond to 740V. The output voltage of the high-voltage part may correspond to the load voltage. The load voltage may correspond to an input voltage of the vehicle. A section in which the load voltage is greater than the target voltage of 740V may correspond to the overvoltage peak section.

Referring to FIG. 2B, for example, the rated voltage may correspond to 720V and the target voltage of the high-voltage part may correspond to 700V. The output voltage of the high-voltage part may correspond to the load voltage. The load voltage may correspond to an input voltage of the vehicle. A section in which the load voltage is smaller than the target voltage of 700V may correspond to the undervoltage peak section.

Figure 3:
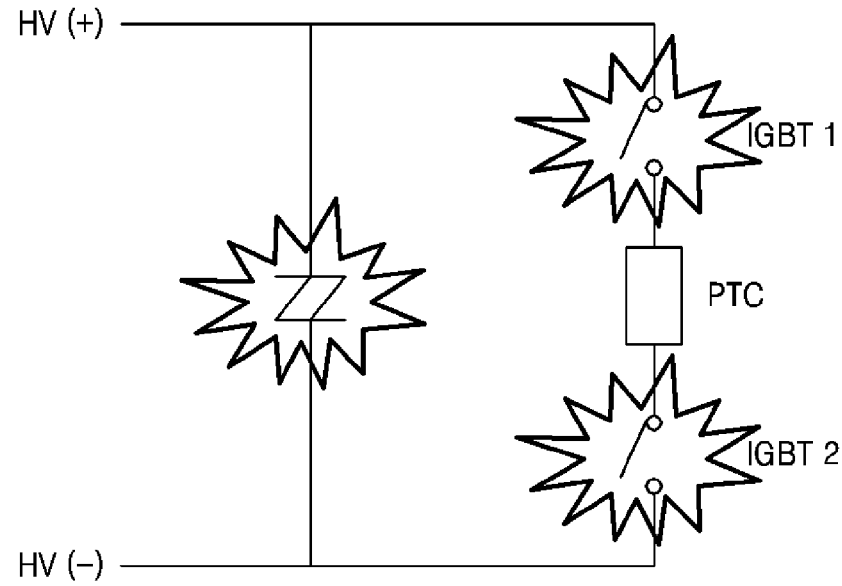
FIG. 3 is a diagram for explaining a circuit in which a part and an input terminal capacitor are connected in parallel, according to one embodiment of the present disclosure.

FIG. 3 is a diagram for explaining a circuit in which a part and an input terminal capacitor are connected in parallel, according to one embodiment of the present disclosure. Capacitor value represents the ability of an electrode to accumulate charge. 1F means a capacitance at which a charge of 1C is accumulated when a voltage of 1V is applied. When capacitors are connected in series, the advantage is that withstand voltage increases and the disadvantage is that combined capacitance decreases. When capacitors are connected in parallel, the advantage is that the combined capacitance increases and the disadvantage is that there is no change in withstand voltage.

Referring to FIG. 3, the high-voltage part may correspond to a positive thermal coefficient (PTC). When one end of a specific element or circuit corresponds to the right end of the specific element or circuit, the other end of the specific element or circuit may correspond to the left end of the specific element or circuit. When one end of a specific element or circuit corresponds to the left end of the specific element or circuit, the other end of the specific element or circuit may correspond to the right end of the specific element or circuit. One end of the PTC may be connected to an insulated gate bipolar transistor (IGBT) 1. The other end of the PTC may be connected to an IGBT 2. The IGBT is a composite device with an input part of a MOSFET structure and an output part of a bipolar structure and corresponds to a transistor which is a bipolar element using two types of carriers, electron and hole, and which has both low saturation voltage and relatively fast switching characteristics. A circuit in which the PTC, the IGBT 1 and the IGBT 2 are connected in series may be connected in parallel with a circuit including capacitors. The circuit including capacitors may be connected in parallel with an input voltage unit. As an example, the circuit including capacitors may correspond to a circuit in which two capacitors are connected in series. As another example, the circuit including capacitors may correspond to a circuit in which two capacitors are connected in parallel. When the overvoltage peak section occurs in the PTC, the circuit including capacitors may correspond to the circuit in which two capacitors are connected in series. When the undervoltage peak section occurs in the PTC, the circuit including capacitors may correspond to the circuit in which two capacitors are connected in parallel.

Figure 4:
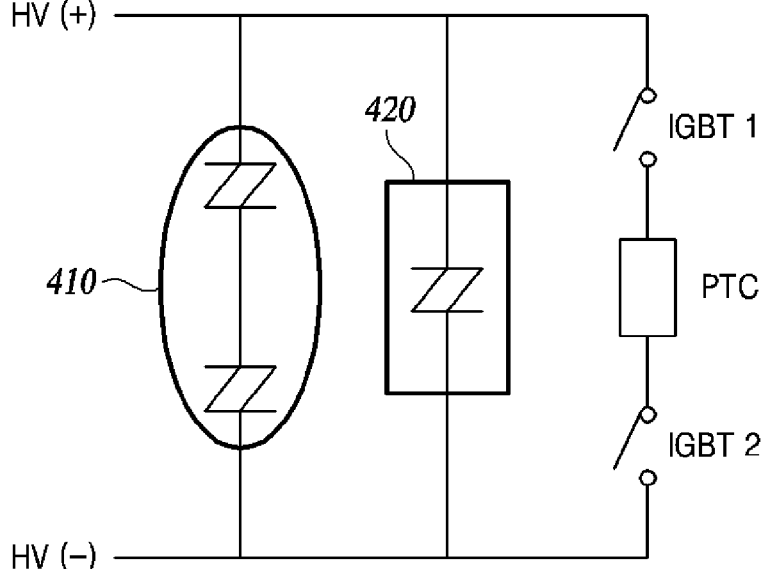
FIG. 4 is a diagram for explaining a circuit for preventing part failure in the overvoltage section and the undervoltage section, according to one embodiment of the present disclosure.

FIG. 4 is a diagram for explaining a circuit for preventing part failure in the overvoltage section and the undervoltage section, according to one embodiment of the present disclosure.

Referring to FIG. 4, for example, the high-voltage part may correspond to a PTC. One end of the PTC may be connected to the IGBT 1. The other end of the PTC may be connected to the IGBT 2. A circuit in which the PTC, the IGBT 1, and the IGBT 2 are connected in series may be connected in parallel with a first circuit 410. The first circuit 410 may be connected in parallel with a second circuit 420. For example, the first circuit 410 may correspond to a circuit in which two capacitors are connected in series. For example, the second circuit 420 may correspond to a circuit including one capacitor. The second circuit 420 is connected in parallel to a circuit in which the circuit of the PTC, the IGBT 1, and the IGBT 2 connected in series and the first circuit 410 are connected in parallel, so that the PTC can be protected in the overvoltage peak section or the undervoltage peak section.

Figure 5:
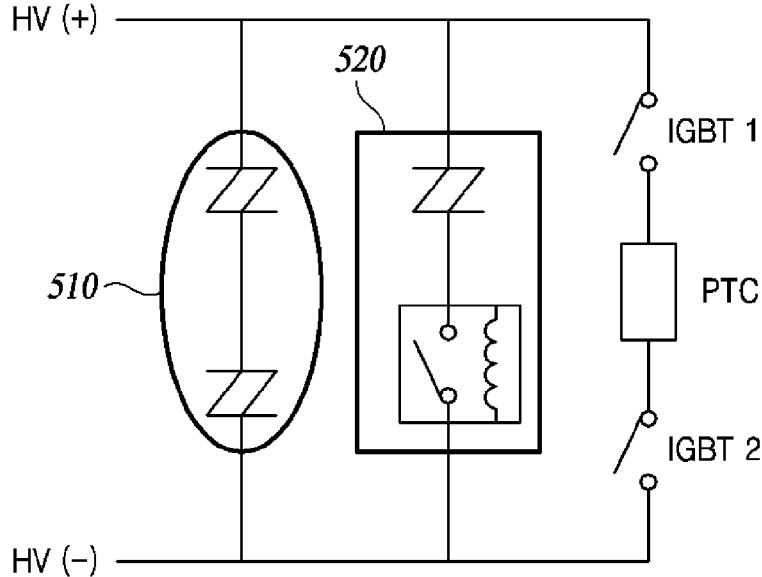
FIG. 5 is a diagram for explaining a circuit for preventing part failure in the overvoltage section and the undervoltage section, according to another embodiment of the present disclosure.

FIG. 5 is a diagram for explaining a circuit for preventing part failure in the overvoltage section and the undervoltage section, according to another embodiment of the present disclosure.

Referring to FIG. 5, for example, the high-voltage part may correspond to a PTC. One end of the PTC may be connected to the IGBT 1. The other end of the PTC may be connected to the IGBT 2. A circuit in which the PTC, the IGBT 1, and the IGBT 2 are connected in series may be connected in parallel with a first circuit 510. The first circuit 510 may be connected in parallel with a second circuit 520. For example, the first circuit 510 may correspond to a circuit in which two capacitors are connected in series. For example, the second circuit 520 may correspond to a circuit in which one capacitor and a relay switch are connected in series. The second circuit 520 is connected in parallel to a circuit in which the circuit of the PTC, the IGBT 1, and the IGBT 2 connected in series and the first circuit 510 are connected in parallel, so that the PTC can be protected in the overvoltage peak section or the undervoltage peak section. For example, the relay switch included in the second circuit 520 may be opened during the overvoltage peak section. Accordingly, the circuit of two capacitors connected in series and the circuit of the PTC, the IGBT 1, and the IGBT 2 connected in series may be connected in parallel. For example, the relay switch included in the second circuit 520 may be closed in the undervoltage peak section. Accordingly, the circuit of two capacitors connected in series, one capacitor, and the circuit of the PTC, the IGBT 1, and the IGBT 2 connected in series may be connected in parallel.

Figure 6:
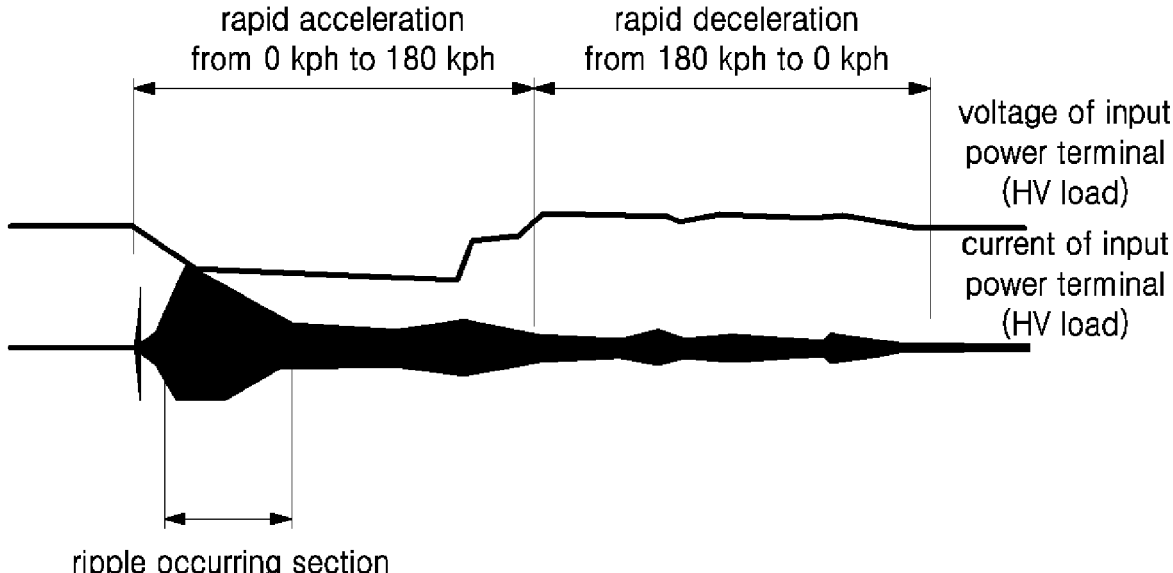
FIG. 6 is a diagram for explaining a current of an input power terminal and a voltage of the input power terminal in a rapid acceleration section, according to one embodiment of the present disclosure.

FIG. 6 is a diagram for explaining a current of an input power terminal and a voltage of the input power terminal in a rapid acceleration section, according to one embodiment of the present disclosure.

Referring to FIG. 6, waveforms of the voltage of the input power terminal of the high-voltage part and waveforms of the current of the input power terminal of the high-voltage part may be expressed over time in a section in which the vehicle rapidly accelerates and a section in which the vehicle rapidly decelerates. When the vehicle rapidly accelerates from 0 kph to 180 kph, the voltage of the input power terminal may be lower than the target voltage due to a voltage drop. The voltage of the input power terminal may correspond to the output voltage of the high-voltage part. A section in which the voltage of the input power terminal is lower than the target voltage may correspond to the undervoltage section. There may be a section in which ripples occur in the undervoltage section. The section in which ripple occurs may correspond to an initial section of the undervoltage section. Current consumption may increase in the section where ripple occurs. Heat may be generated due to shock caused by rapid charging and discharging of the ripple current in the capacitor, which may burn out the capacitor. When the vehicle rapidly decelerates from 180 kph to 0 kph, the voltage of the input power terminal may be higher than the target voltage. A section in which the voltage of the input power terminal is higher than the target voltage may correspond to the overvoltage section.

Figure 7:
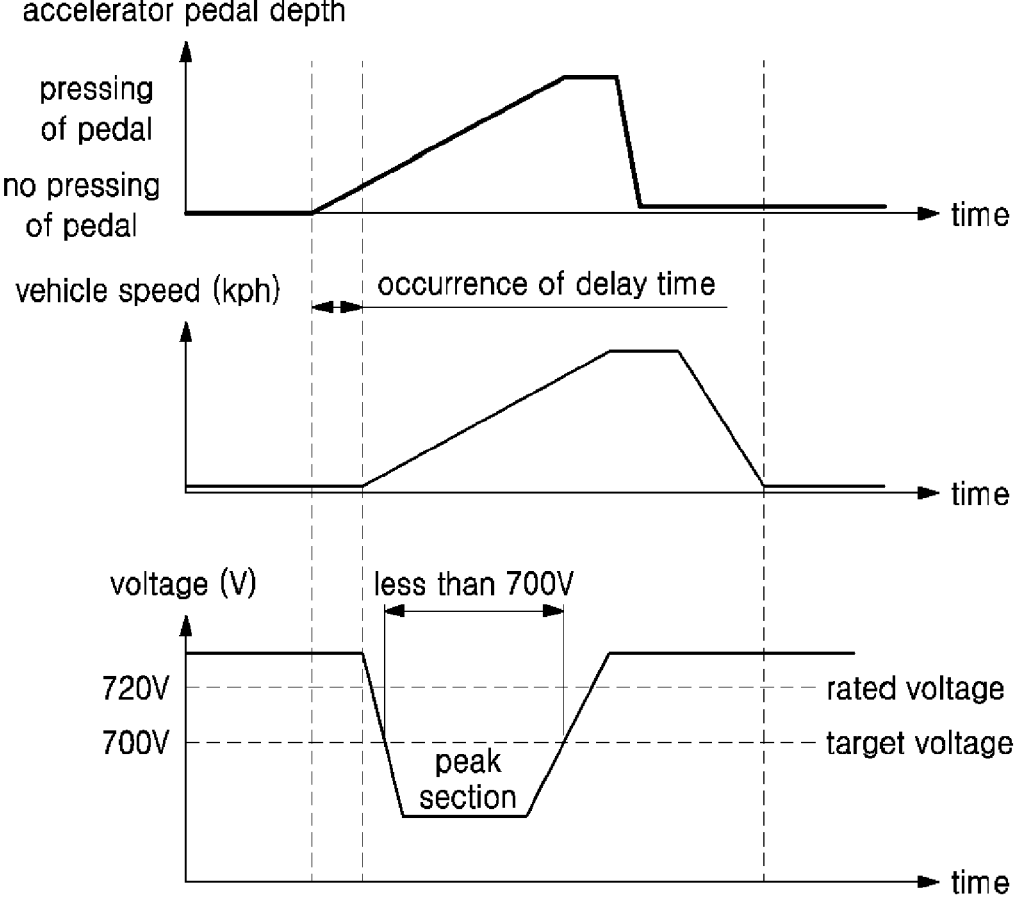
FIG. 7 is a diagram for explaining a vehicle speed depending on an accelerator pedal depth and an output voltage of a load, according to one embodiment of the present disclosure.

FIG. 7 is a diagram for explaining a vehicle speed depending on an accelerator pedal depth and an output voltage of a load according to one embodiment of the present disclosure.

Referring to FIG. 7, the depth of the accelerator pedal, the vehicle speed, and the output voltage of the load according to time may be graphed. When the accelerator pedal is pressed, the vehicle speed may increase. When the accelerator pedal is pressed, the vehicle speed may increase after a delay time. As the vehicle speed increases, the output voltage of the load may become lower than the target voltage of 700V due to a voltage drop. A section in which the output voltage of the load is lower than the target voltage of 700V may correspond to the undervoltage peak section. Ripples may occur in the initial section of the undervoltage peak section. According to the occurrence of the delay time, an increase in accelerator pedal depth may precede a change in vehicle speed and a change in output voltage of the load. While monitoring the accelerator pedal, the vehicle controller may predict in advance a change in the output voltage of the load when the accelerator pedal depth increases. The vehicle controller may perform relay control in the undervoltage peak section by predicting a change in the output voltage of the load in advance.

Figure 8A:
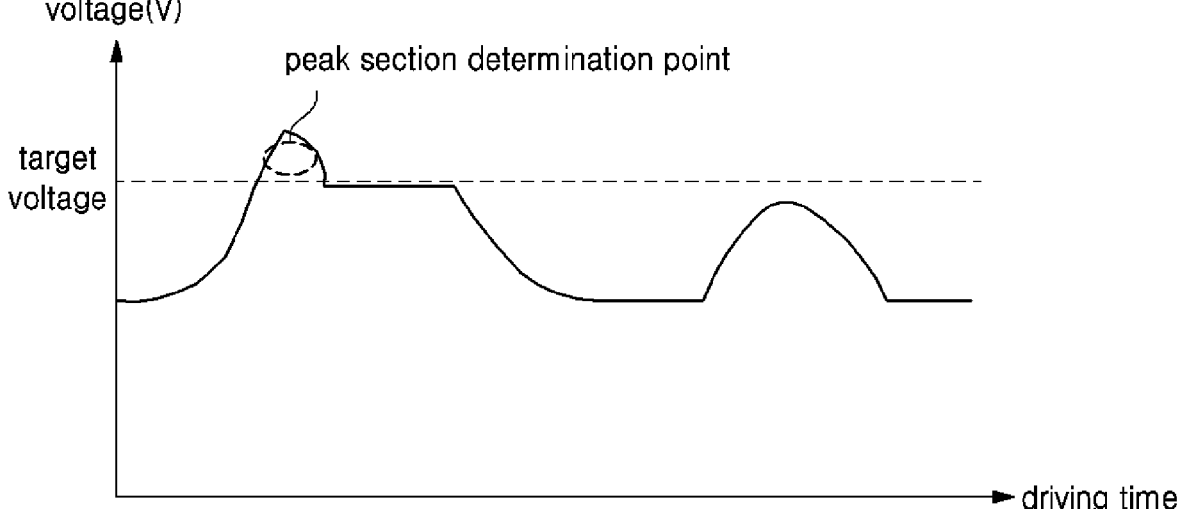
FIGS. 8A and 8B are diagrams for explaining an overvoltage start point and a relay control start point, according to one embodiment of the present disclosure.
Figure 8B:
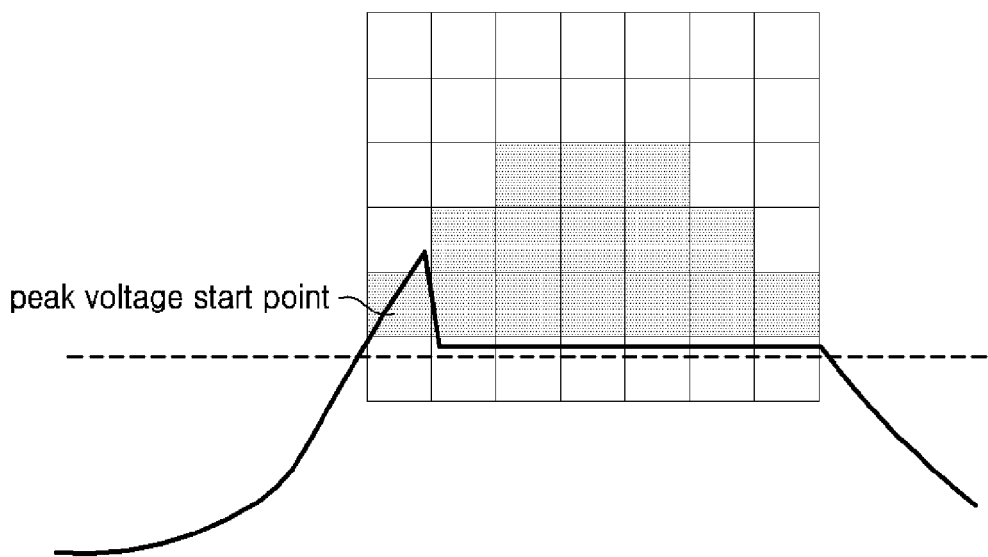

FIGS. 8A and 8B are diagrams for explaining an overvoltage start point and a relay control start point, according to one embodiment of the present disclosure.

Referring to FIG. 8A, a period in which the output voltage of the high-voltage part is higher than the target voltage may be determined as the overvoltage peak section. A point at which the output voltage of the high-voltage part becomes higher than the target voltage may correspond to an overvoltage peak section determination point.

Referring to FIG. 8B, the point at which the output voltage of the high-voltage part becomes higher than the target voltage may correspond to the peak voltage start point. When the output voltage of the high-voltage part exceeds the target voltage, the vehicle controller may start to determine that the output voltage of the high-voltage part is in a high-voltage section. When the area of the output voltage of the high-voltage part over time in the high-voltage section corresponds to 50% or more of the area of the entire high-voltage section, the vehicle controller may transmit a relay control signal to the load controller to reduce the output voltage of the high-voltage part. When the area of the output voltage of the high-voltage part over time in the high-voltage section corresponds to 50% or more of the area of the entire high-voltage section, the vehicle controller may transmit a signal to open the relay switch to the load controller.

Figure 9A:
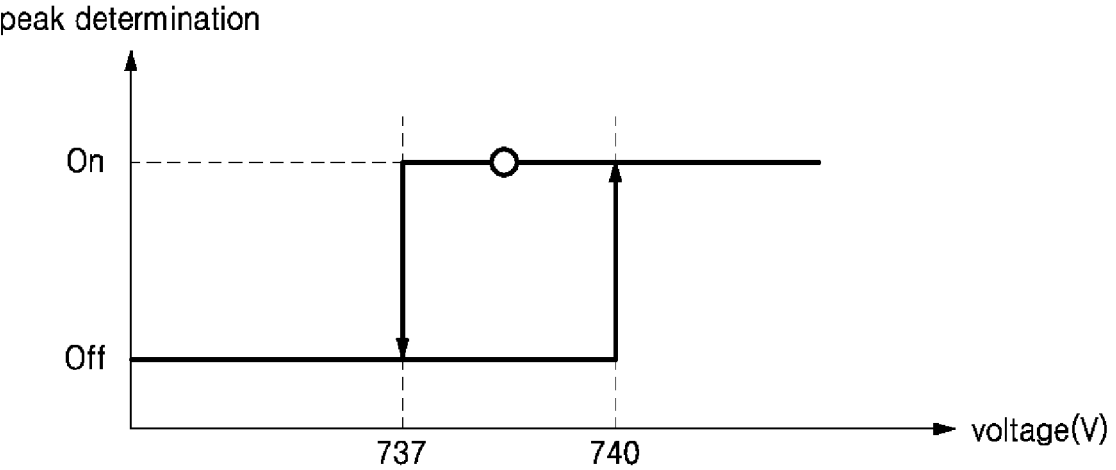
FIGS. 9A and 9B are diagrams for explaining a method of performing relay control in consideration of hysteresis, according to one embodiment of the present disclosure.
Figure 9B:
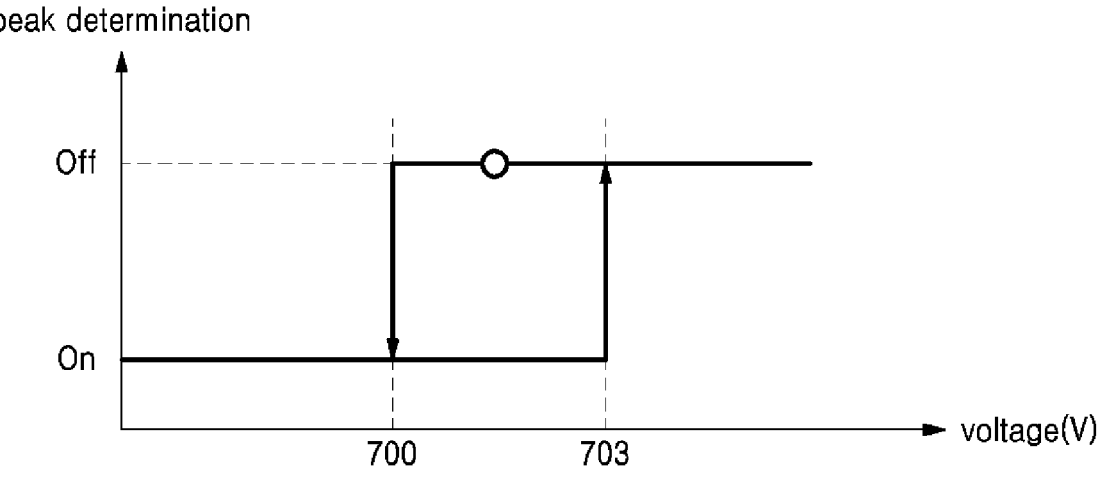

FIGS. 9A and 9B are diagrams for explaining a method of performing relay control in consideration of hysteresis, according to one embodiment of the present disclosure.

Referring to FIG. 9A, in case the target voltage is 740V, when the output voltage of the part exceeds 740V, it may be determined to be in the overvoltage section. When it is determined as the overvoltage peak section, the relay switch may be opened. When the output voltage of the part is less than 740V and greater than 737V after it is determined to be in the overvoltage peak section, it may be determined to be continuously in the overvoltage peak section. When the output voltage of the part becomes smaller than 737V after it is determined to be in the overvoltage peak section, it may be determined not to be in the overvoltage peak section. In this case, the relay switch may maintain the opened state.

Referring to FIG. 9B, in case the target voltage is 700V, when the output voltage of the part becomes less than 700V, it may be determined to be in the undervoltage peak section. When it is determined to be in the undervoltage peak section, the relay switch may be closed. When the output voltage of the part becomes greater than 700V and less than 703V after it is determined to be in the undervoltage peak section, it may be determined to be continuously in the undervoltage peak section. When the output voltage of the part becomes greater than 703V after it is determined to be in the undervoltage peak section, it may be determined not to be in the undervoltage peak section. In this case, the relay switch may maintain the closed state.

Figure 10:
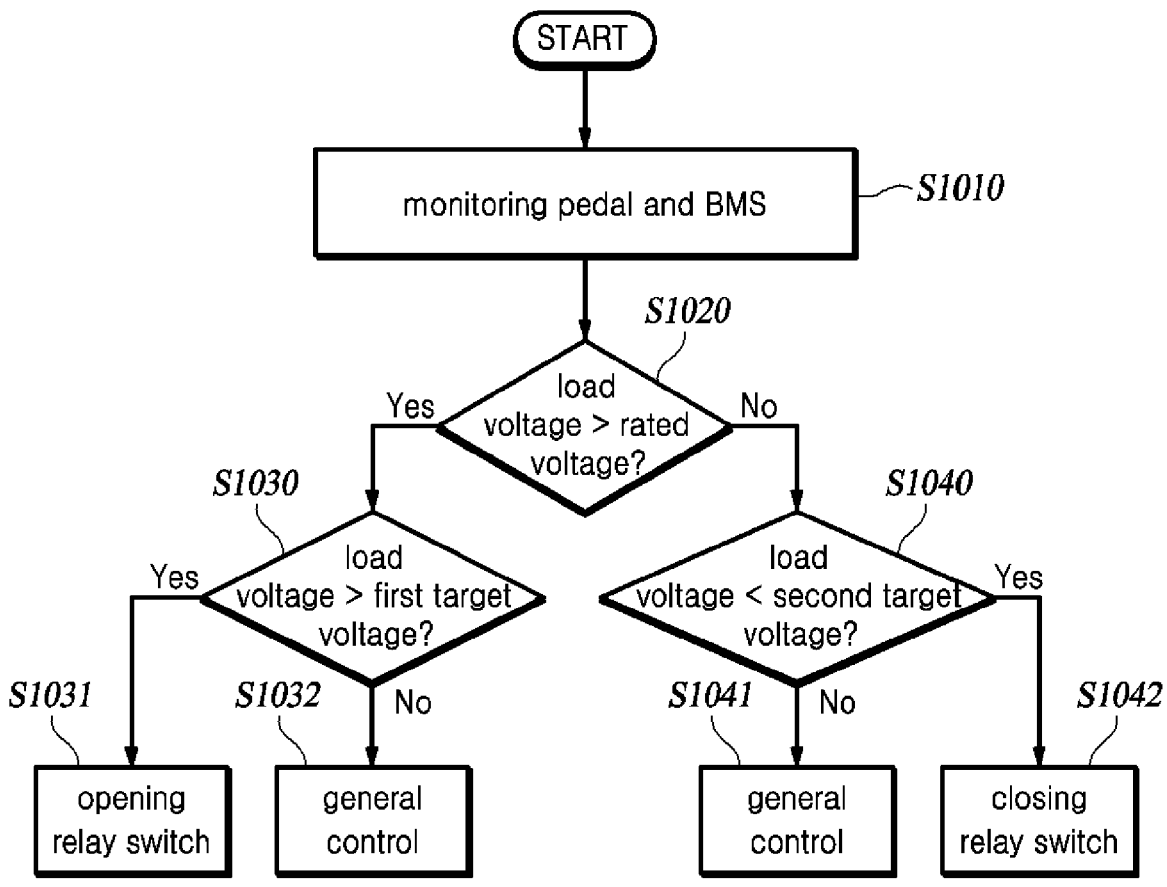
FIG. 10 is a diagram for explaining a method of controlling an output voltage of a load, according to one embodiment of the present disclosure.

FIG. 10 is a diagram for explaining a method of controlling an output voltage of a load, according to one embodiment of the present disclosure.

Referring to FIG. 10, the pedal, the BMS, and the like may be monitored (S1010). It may be determined whether the load voltage is greater than the rated voltage (S1020). For example, the rated voltage may correspond to 720V. When the load voltage is greater than the rated voltage (S1020—YES), it may be determined whether the load voltage is greater than a first target voltage (S1030). For example, the first target voltage may correspond to 740V. When the load voltage is greater than the first target voltage (S1030—YES), the relay switch may be opened (S1031). In this case, it may be determined to be in the overvoltage peak section. When the load voltage is equal to or less than the first target voltage (S1030—NO), general control may be performed by the vehicle controller (S1032). The general control may correspond to a control that keeps the relay switch open or closed depending on the load voltage.

When the load voltage is equal to or less than the rated voltage (S1020—NO), it may be determined whether the load voltage is less than a second target voltage (S1040). For example, the second target voltage may correspond to 700V. When the load voltage is equal to or greater than the second target voltage (S1040—NO), general control may be performed by the vehicle controller (S1041). The general control may correspond to a control that keeps the relay switch open or closed depending on the load voltage. When the load voltage is less than the second target voltage (S1040—YES), the relay switch may be closed (S1042). In this case, it may be determined to be in the undervoltage peak section.

According to embodiments of the present disclosure, a method and apparatus for protecting parts and internal elements of parts in the overvoltage section or the undervoltage section can be provided.

In addition, according to embodiments of the present disclosure, a method and apparatus for preventing failure of a part in the overvoltage section or the undervoltage section by connecting a circuit including a capacitor to the part in parallel can be provided.

Further, according to embodiments of the present disclosure, a method and apparatus for controlling a voltage output from a load through relay control can be provided.

Furthermore, according to embodiments of the present disclosure, a method and apparatus for controlling a voltage output from a load in consideration of time and magnitude of a voltage in the overvoltage section or the undervoltage section can be provided.

The effects obtainable by embodiments of the present disclosure are not limited to the effects mentioned above, and other effects not mentioned will be clearly understood by those skilled in the art from the description herein.

Each element of the apparatus or method in accordance with embodiments of the present invention may be implemented in hardware or software or in a combination of hardware and software. The functions of the respective elements may be implemented in software, and a microprocessor may be implemented to execute the software functions corresponding to the respective elements.

Various embodiments of systems and techniques described herein can be realized with digital electronic circuits, integrated circuits, field programmable gate arrays (FPGAs), application specific integrated circuits (ASICs), computer hardware, firmware, software, and/or combinations thereof. The various embodiments can include implementation with one or more computer programs that are executable on a programmable system. The programmable system includes at least one programmable processor, which may be a special purpose processor or a general purpose processor, coupled to receive and transmit data and instructions from and to a storage system, at least one input device, and at least one output device. Computer programs (also known as programs, software, software applications, or code) include instructions for a programmable processor and are stored in a "computer-readable recording medium."

The computer-readable recording medium may include all types of storage devices on which computer-readable data can be stored. The computer-readable recording medium may be a non-volatile or non-transitory medium such as a read-only memory (ROM), a compact disc ROM (CD-ROM), magnetic tape, a floppy disk, a memory card, a hard disk, or an optical data storage device. In addition, the computer-readable recording medium may further include a transitory medium such as a data transmission medium. Furthermore, the computer-readable recording medium may be distributed over computer systems connected through a network, and computer-readable program code can be stored and executed in a distributive manner.

Although operations are illustrated in the flowcharts/ timing charts in this specification as being sequentially performed, this is merely an exemplary description of the technical idea of one embodiment of the present disclosure. In other words, those skilled in the art to which one embodiment of the present disclosure belongs may appreciate that various modifications and changes can be made without departing from essential features of an embodiment of the present disclosure, that is, the sequence illustrated in the flowcharts/timing charts can be changed and one or more operations of the operations can be performed in parallel. Thus, flowcharts/timing charts are not limited to the temporal order.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. A circuit comprising:
a load circuit comprising a first insulated gate bipolar transistor (IGBT), a second IGBT, and a component, a first end of the component being connected to the first IGBT and a second end of the component being connected to the second IGBT;
a first circuit comprising a first capacitor and a relay switch which are connected in series; and
a second circuit comprising a second capacitor and a third capacitor,
wherein the second capacitor and the third capacitor are connected in series,
wherein the load circuit, the first circuit, and the second circuit are connected in parallel, and
wherein the relay switch is open or closed based on a magnitude of an output voltage of the component.

2. The circuit of claim 1, wherein in a case in which the output voltage of the component is greater than a first target voltage and is in an overvoltage peak section, the relay switch is opened.

3. The circuit of claim 2, wherein in a case in which the output voltage of the component is less than a value obtained by subtracting a hysteresis voltage from the first target voltage, the output voltage of the component is not in the overvoltage peak section.

4. The circuit of claim 2, wherein the first target voltage is a preset value greater than a rated voltage.

5. The circuit of claim 1, wherein in a state in which the output voltage of the component is less than a second target voltage and is in an undervoltage peak section, the relay switch is closed.

6. The circuit of claim 5, wherein in a state in which the output voltage of the component is greater than a value obtained by adding a hysteresis voltage to the second target voltage, the output voltage of the component is not in the undervoltage peak section.

7. The circuit of claim 5, wherein the second target voltage is a preset value less than a rated voltage.

8. The circuit of claim 1, wherein the relay switch is open or closed based on an area in consideration of a time and the magnitude of the output voltage of the component.

9. The circuit of claim 1, wherein the component comprises a high voltage component.

10. A method performed by a vehicle controller, the method comprising:
monitoring a plurality of devices in a vehicle; and
controlling a relay switch based on a magnitude of an output voltage of a component in the vehicle and the plurality of devices,
wherein the relay switch is opened or closed based on the magnitude of the output voltage of the component,
wherein the component and the relay switch are connected in parallel, and
wherein controlling the relay switch comprises closing the relay switch in response to a determination that the output voltage of the component is less than a second target voltage and is in an undervoltage peak section.

11. The method of claim 10, wherein controlling the relay switch comprises opening the relay switch in response to a determination that the output voltage of the component is greater than a first target voltage and is in an overvoltage peak section.

12. The method of claim 11, wherein in a case in which the output voltage of the component is less than a value obtained by subtracting a hysteresis voltage from the first target voltage, the output voltage of the component is not in the overvoltage peak section.

13. The method of claim 11, wherein the first target voltage is a preset value greater than a rated voltage.

14. The method of claim 10, wherein, in a case in which the output voltage of the component is greater than a value obtained by adding a hysteresis voltage to the second target voltage, the output voltage of the component is not in the undervoltage peak section.

15. The method of claim 10, wherein the second target voltage is a preset value less than a rated voltage.

16. The method of claim 10, wherein the relay switch is open or closed based on an area in consideration of a time and the magnitude of the output voltage of the component.

17. The method of claim 10, wherein the component comprises a high voltage component.

18. The method of claim 10,
wherein the vehicle controller comprises a trained learning model, and
wherein the method further comprises transmitting, by the trained learning model of the vehicle controller, a relay control signal that is configured to control the relay switch via a load controller.

19. A method performed by a vehicle controller, the method comprising:
monitoring a plurality of devices in a vehicle, wherein the plurality of devices comprises a pedal and a battery management system (BMS);
predicting a change in an output voltage of a component in the vehicle based on a change in a depth of the pedal; and
controlling a relay switch based on the predicted change in the output voltage of the component and the plurality of devices,
wherein the relay switch is opened or closed based on a magnitude of the output voltage of the component,
wherein the component and the relay switch are connected in parallel,
wherein controlling the relay switch comprises closing the relay switch in response to a determination that the output voltage of the component is less than a second target voltage and is in an undervoltage peak section, and
wherein controlling the relay switch comprises opening the relay switch in response to a determination that the output voltage of the component is greater than a first target voltage and is in an overvoltage peak section.

20. The method of claim 19, wherein predicting the change in the output voltage of the component comprises determining that the output voltage of the component will enter the undervoltage peak section based on a delay time between the change in the depth of the pedal and a corresponding change in a speed of the vehicle.

* * * * *